United States Patent
Partiwala et al.

(10) Patent No.: US 7,457,363 B2
(45) Date of Patent: Nov. 25, 2008

(54) METHOD AND APPARATUS FOR MULTI-THREADED VARIABLE LENGTH CODING

(75) Inventors: Suketu R. Partiwala, Chandler, AZ (US); Kalpesh D. Mehta, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 733 days.

(21) Appl. No.: 10/882,973

(22) Filed: Jun. 30, 2004

(65) Prior Publication Data

US 2006/0002481 A1   Jan. 5, 2006

(51) Int. Cl.
*H04B 1/66* (2006.01)
(52) U.S. Cl. .................. 375/253; 382/245; 382/246; 375/E7.093; 375/E7.144
(58) Field of Classification Search .......... 382/246, 382/245; 375/253, E7.093, E7.144
See application file for complete search history.

(56) References Cited

U.S. PATENT DOCUMENTS

| | | | | | |
|---|---|---|---|---|---|
| 5,623,423 | A | * | 4/1997 | Lipovski | 708/203 |
| 5,812,791 | A | * | 9/1998 | Wasserman et al. | 709/247 |
| 5,881,070 | A | * | 3/1999 | Hoshi | 714/752 |
| 5,991,340 | A | * | 11/1999 | Isomura | 375/253 |
| 6,055,272 | A | * | 4/2000 | Kim | 375/240.23 |
| 6,205,254 | B1 | * | 3/2001 | Koshi et al. | 382/239 |
| 6,330,277 | B1 | * | 12/2001 | Gelblum et al. | 375/222 |
| 6,731,686 | B1 | * | 5/2004 | Sudharsanan et al. | 375/240.25 |
| 6,879,637 | B1 | * | 4/2005 | Nakagawa et al. | 375/253 |
| 2002/0009153 | A1 | * | 1/2002 | Jeon et al. | 375/253 |
| 2004/0081245 | A1 | * | 4/2004 | Deeley et al. | 375/253 |

* cited by examiner

*Primary Examiner*—Samir A Ahmed
*Assistant Examiner*—Stephen R Koziol
(74) *Attorney, Agent, or Firm*—Blakely, Sokoloff, Taylor & Zafman LLP

(57) ABSTRACT

A device including a variable length coding unit that includes an input unit connected to a stream switching unit, and an output unit connected to the stream switching unit. The input unit to encode at least two input streams simultaneously. The output unit to transmit output streams to an output interface connected to the output unit.

18 Claims, 8 Drawing Sheets

METHOD AND APPARATUS FOR MULTI-THREADED VARIABLE LENGTH CODING

BACKGROUND

1. Field

The embodiments relate to variable length coding (VLC) units, and more particularly to VLC unit within a multiprocessor environment.

2. Description of the Related Art

Image and Video compression standards like joint photographics expert group (JPEG), moving picture experts group (MPEG), such as MPEG2 and MPEG4, use variable length coding (VLC) based on a data compression technique that varies the length of the encoded symbol in proportion to its information content. That is the more often a symbol or token is used, the shorter the codeword used to represent it in the compressed stream. This type of coding is referred to as Huffman coding, which reduces data redundancy. VLC based on Huffman Coding is the most popular lossless data compression technique and is recommended by many image and video standards such as JPEG, MPEG, MPEG2, and MPEG4.

A VLC data flow pipeline may be described as follow. Each block of input (e.g., 64 words) is first placed in zigzag order. The zigzagged data is then run-length coded (counting the number of zero values before a non-zero value). The resulting (run, level) information is used in the next stage to lookup VLC tables to determine its codeword. The variable length codeword is then bit-packed in the last stage and set out as an output stream.

BRIEF DESCRIPTION OF THE DRAWINGS

The embodiments of the invention are illustrated by way of example and not by way of limitation in the figures of the accompanying drawings in which like references indicate similar elements. It should be noted that references to "an" embodiment of the invention in this disclosure are not necessarily to the same embodiment, and they mean at least one.

DETAILED DESCRIPTION

The embodiments discussed herein generally relate to a method and apparatus for variable length coding. Referring to the figures, exemplary embodiments will now be described. The exemplary embodiments are provided to illustrate the embodiments and should not be construed as limiting the scope of the embodiments.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Out of all variable length coding (VLC) processing, a VLC table look up requires the most die-area on a processor due to the need for large memories to store code tables. The rest of the logic is generally less die-area intensive. In a typical scenario, input sub-units are used heavily as compared to output units, which are used lightly. The reason for this is that there are far fewer (run, level) pairs generated compared to the total number of data input. Therefore, a VLC pipeline has imbalances in terms of sub-unit resource utilization. That is, the input pre-processing units have higher utilization compared to VLC table lookup and bitpacking units. A run level coder (RLC) and zigzag unit are used every cycle. On the other hand, the VLC table lookup is busy only when there is a valid (run, level) pair generated by the RLC. For example, a block of input data stream contains 25-50% non-zero values. Hence the downstream units are inactive for about 50-75% of the time. Note that the table lookup is the most die-area intensive unit and it remains utilized under 50%.

Figure 1A:
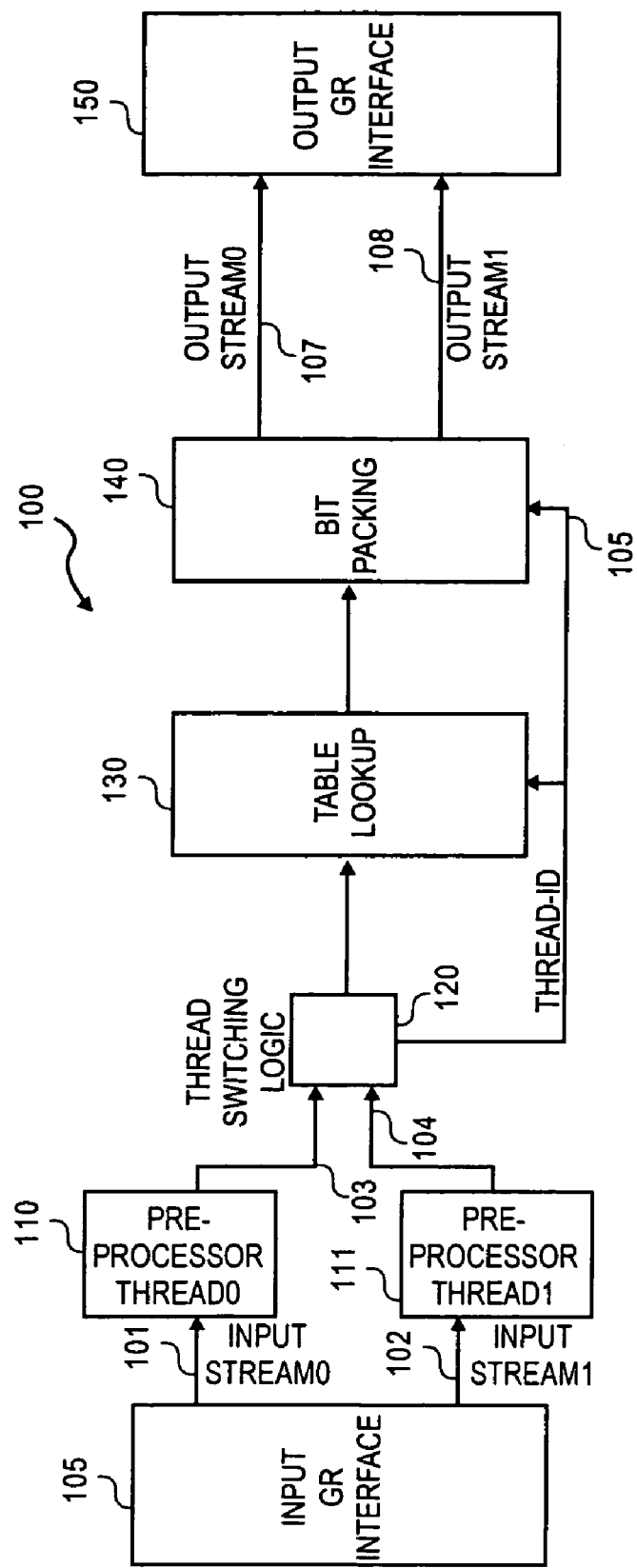
FIG. 1A illustrates a multi-threaded (or multi-streamed) variable length coding (VLC) pipeline within a VLC unit.

FIG. 1A illustrates a multi-threaded (or multi-streamed) variable length coding (VLC) pipeline within a VLC unit. In one embodiment, VLC unit 100 is included on a processor element (PE) 310 (illustrated in FIG. 3). VLC unit 100 includes input interface 105 (e.g., a general purpose register (GPR) connected to at least two thread/stream preprocessors 110 and 111. Stream/thread switching unit 120 is connected to preprocessors 110 and 111. An output unit includes table lookup unit 130 and bit packing unit 140. Table lookup unit 130 is connected to stream/thread switching unit 120 and bit packing unit 140. Output interface 150 is connected to bit packing unit 140.

In VLC unit 100, input stream/thread 101 is transmitted from input interface 105 to preprocessor 110. Input stream/thread 102 is transmitted from input interface 105 to preprocessor 111. It should be noted that input thread/streams 101 and 102 can be components from a single video stream or two completely separate video streams. Preprocessor units 110 and 111 include a zigzag unit and a run level coding unit. After stream/thread 101 and 102 are each processed by the zigzag unit and run level coding unit in their respective preprocessors (110 and 111), modified stream/threads 103 and 104 are transmitted to stream/thread switching unit 120. Stream/threads 103 and 104 each include a run/level pair.

Thread/stream switching unit 120 transmits a thread/stream identification (ID) to table lookup unit 130 and bit packing unit 140. The thread/stream ID informs the output unit of the thread/stream that is currently being processed. That is, thread/stream switching unit determines which thread/stream to currently process so as to achieve peak performance by processing the stream/thread having non-zero data. After the output unit has bitpacked the threads/streams, output interface 150 can either transmit the resulting threads/streams to different GPRs based on the thread/stream ID, or transmit the threads/streams to one GPR but route the thread/stream to different PEs 310 using different set bits, i.e. DVSET bits. The GPRs (also known as communication control registers) are used to communicate or transfer information from one PE to another. It should be noted that output stream/thread 107 and output thread/stream 108 are simultaneously transmitted to output interface 150.

Figure 5:
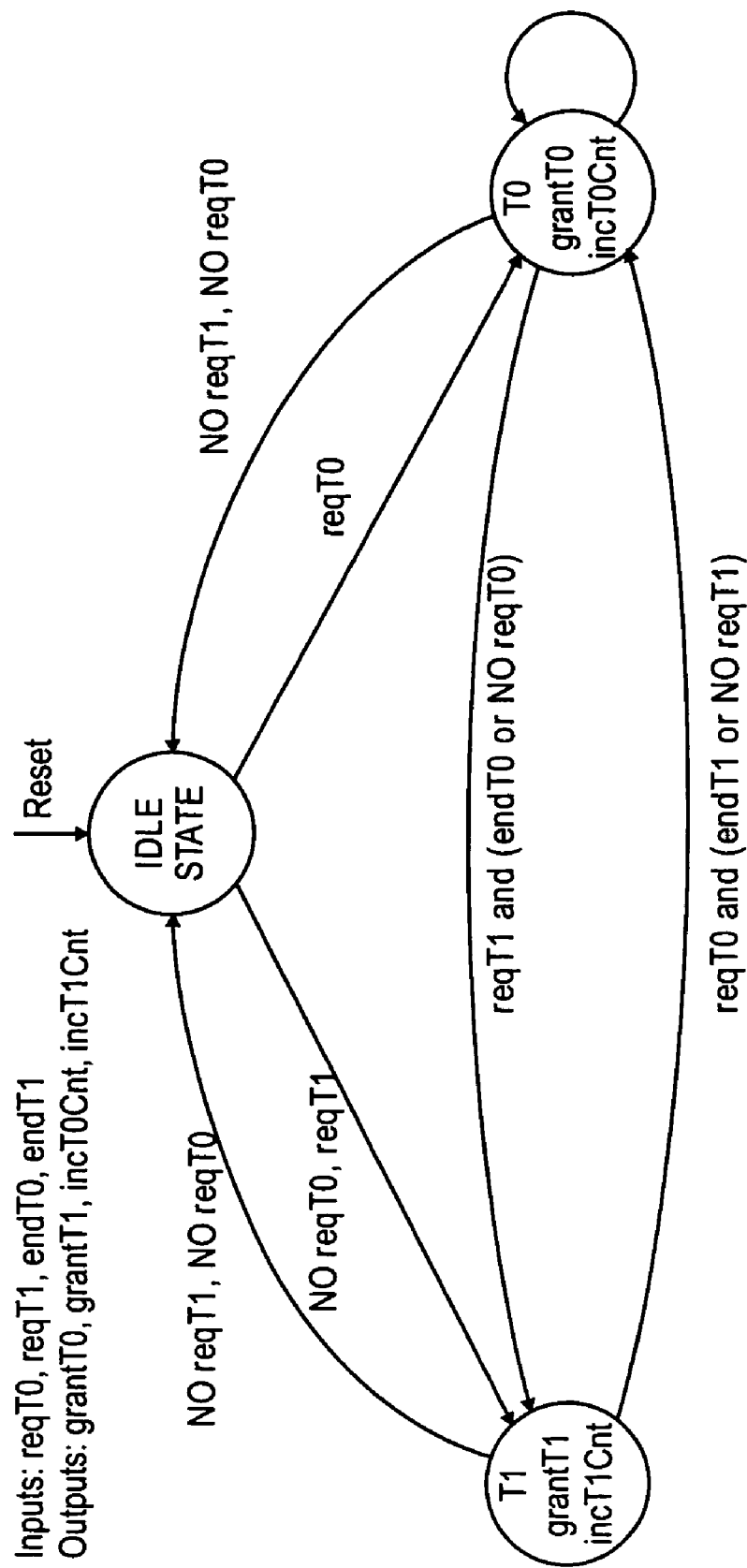
FIG. 5 illustrates a stream/thread arbitration state diagram.

In one embodiment, thread switching unit 120 contains an arbitration process. (FIG. 5 illustrates a thread/stream arbitration state diagram for the arbitration process running in switching unit 120.) The thread/stream arbitration process gives higher priority to a stream/thread currently being processed, unlike traditional thread switching logic that uses round robin algorithms. Stream/thread switching unit 120 adjusts transmission of stream/thread 103 and 104 so that a peak utilization period for stream/thread 103 and a peak utilization period for stream/thread 104 are non-overlapping.

Figure 1B:
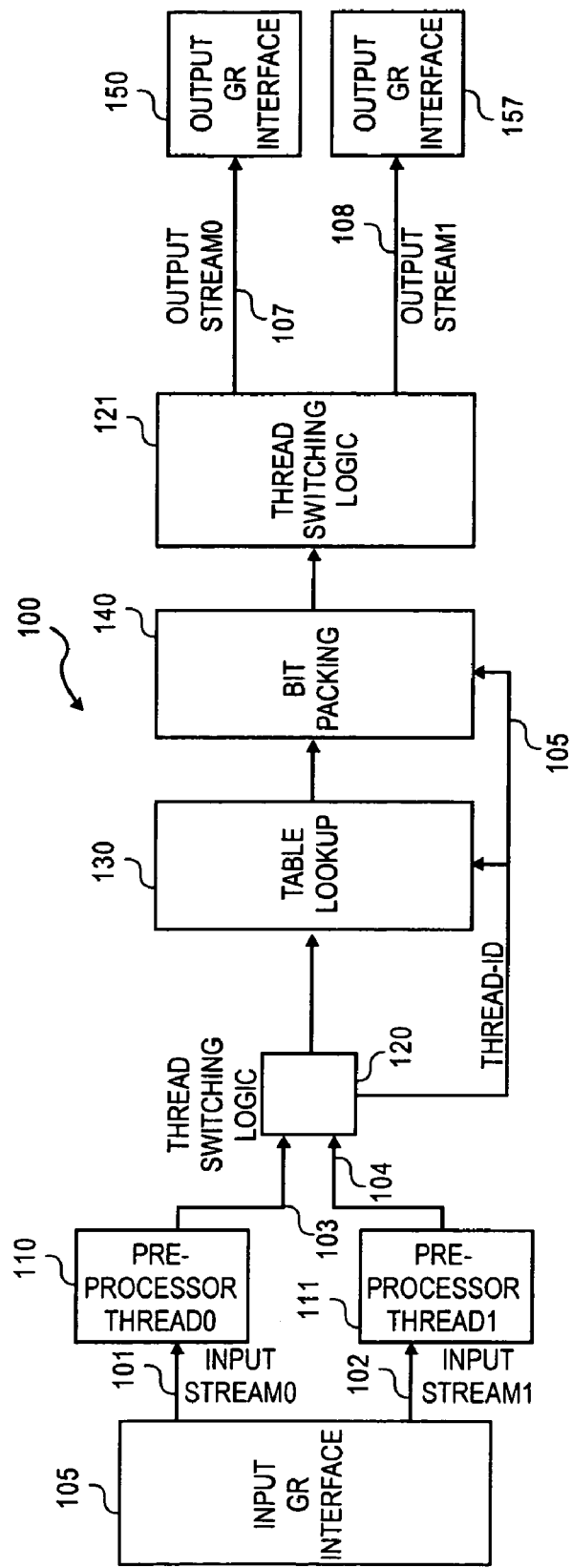
FIG. 1B illustrates another embodiment of a multi-threaded (or multi-streamed) variable length coding (VLC) pipeline within a VLC unit.

FIG. 1B illustrates another embodiment of a multi-threaded (or multi-streamed) VLC pipeline within a VLC unit. This embodiment is similar to the embodiment illustrated in FIG. 1A albeit the portion after bit packing unit 140. In this embodiment, an output stream is transmitted from bit packing unit 140 to thread switching logic 121, which routes and/or splits the stream into streams, such as output stream0 107 and output stream1 108. Output stream0 107 and output stream1 108 are routed to output graphic interface 150 and output graphic interface 151.

Figure 2:
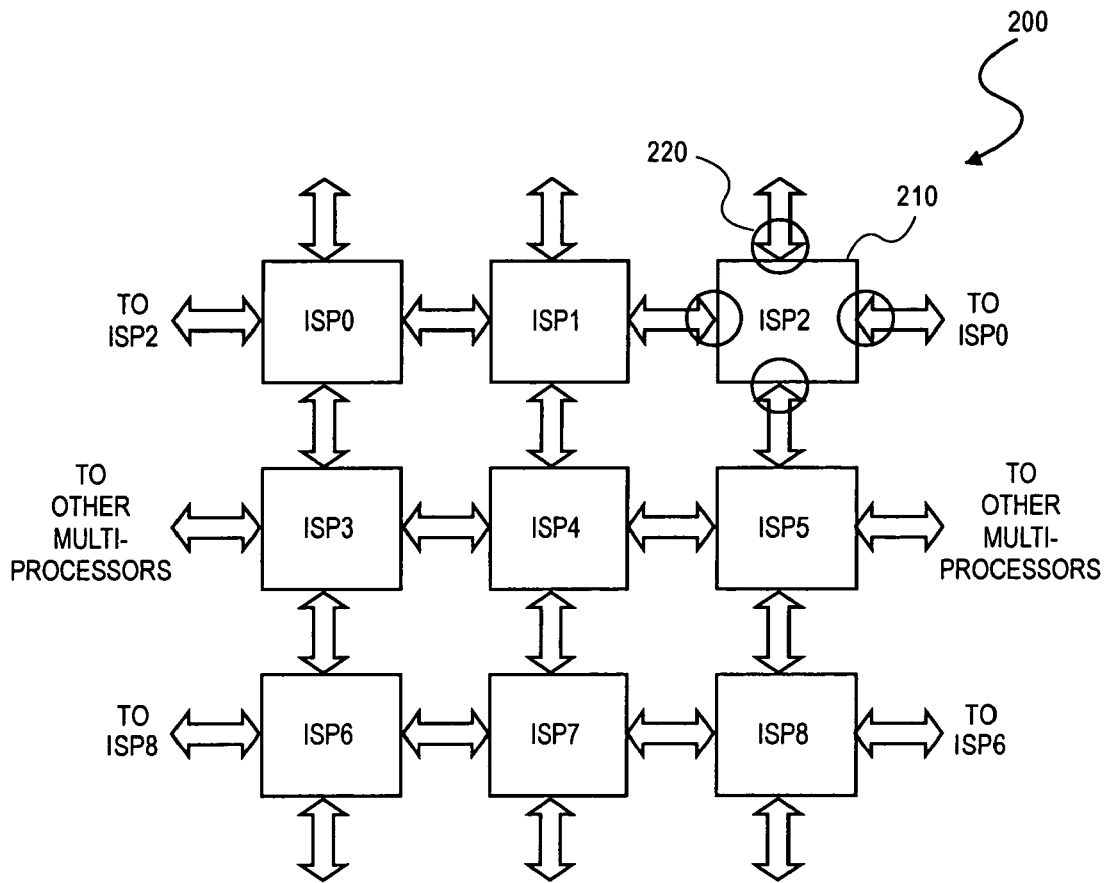
FIG. 2 illustrates a multiprocessor chip.

FIG. 2 illustrates processing chip 200 designed to implement complex image processing algorithms using one or more image signal processors (ISP) 210 connected together in a mesh configuration using quad-ports 220. The quad-ports can be configured (statically) to connect various ISP's to other ISP's or to double data rate (DDR) memory using direct memory access (DMA) channels. FIG. 2 shows nine (9) ISP's 210 connected together with quad-ports 220. It should be noted that configurations with more or less ISPs 210 does not alter the scope of the embodiments to be discussed. ISP's 210 comprise several processor elements (PEs) 310 (illustrated in FIG. 3) coupled together with register file switch 320 (illustrated in FIG. 3). An ISP 210 in one multiprocessor can connect to an ISP in another multiprocessor via expansion interfaces, therefore increasing the number of ISPs coupled to one another.

Figure 3:
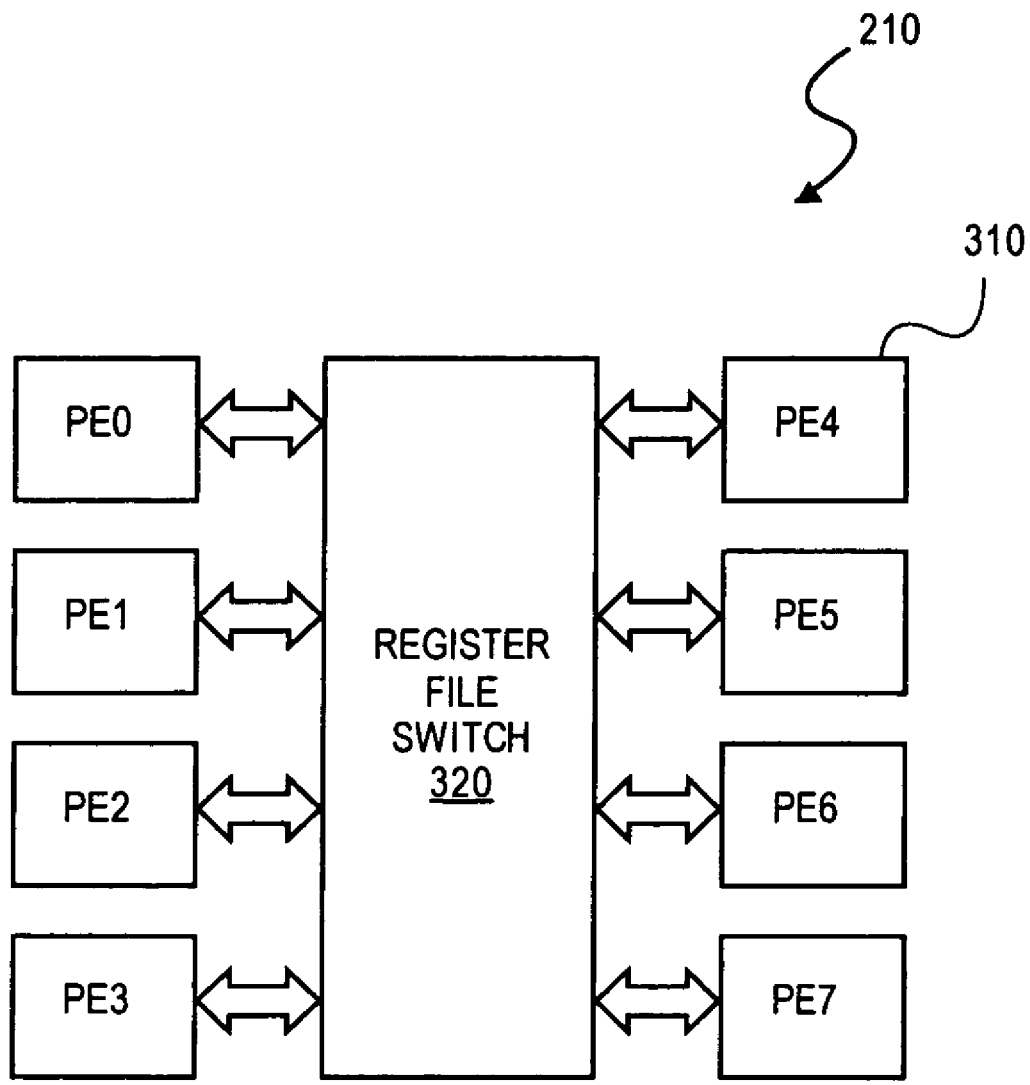
FIG. 3 illustrates a plurality of processing elements (PEs) coupled with a register file switch.

FIG. 3 illustrates register file switch 320 that provides a fast and efficient interconnect mechanism. In achieving high performance, individual threads are mapped to PE's 310 in a way as to minimize communication overhead. The programming model ISP's 210 is such that each PE 310 implements a part of an algorithm and data flows from one PE 310 to another and from one ISP 210 to another until the algorithm is completely processed.

Disposed within each ISP 210 are PEs 310 as follows: an input PE (IPE), an output PE (OPE), one or more MACPEs and one or more general purpose PE (GPE). Also, included disposed within each ISP 210 is a memory command handler (MCH), etc. Data enters an ISP 210 through an IPE. The GPE's and other special purpose PEs process the incoming data. The data is sent out to a next ISP 210 by an OPE. In one embodiment, at least one (up to a maximum of three) PEs 310 are hardware accelerators (HWA). The hardware accelerators are designed to do specific functions, such as discrete cosine transform (DCT), motion estimation, VLC, etc.

PE 310 uses a data driven mechanism to process data. In this data driven method, each piece of data in the system has a set of data valid (DV) bits that indicate for which PE 310 the data is intended. Thus, if a register data is intended for two specific PE's 310 (e.g., PE0 and PE1), then the DV bit 0 and 1 of the register is set. If PE0 no longer needs the data, then it resets the DV bit 0. When the DV bits of all the consumer PE's in a register are reset, the producer PE can go ahead and write new data into the register with a new set having a DV bit setting. Otherwise, producer PE is stalled until the consumer PE's have reset their respective DV bits. Similarly, if a PE attempts to read a piece of data from a register and if its DV bit is not set, the PE stalls until there is data with a DV bit corresponding to the consumer PE set. This mechanism provides a very powerful method to share and use registers and significantly simplifies the user-programming model.

Figure 4:
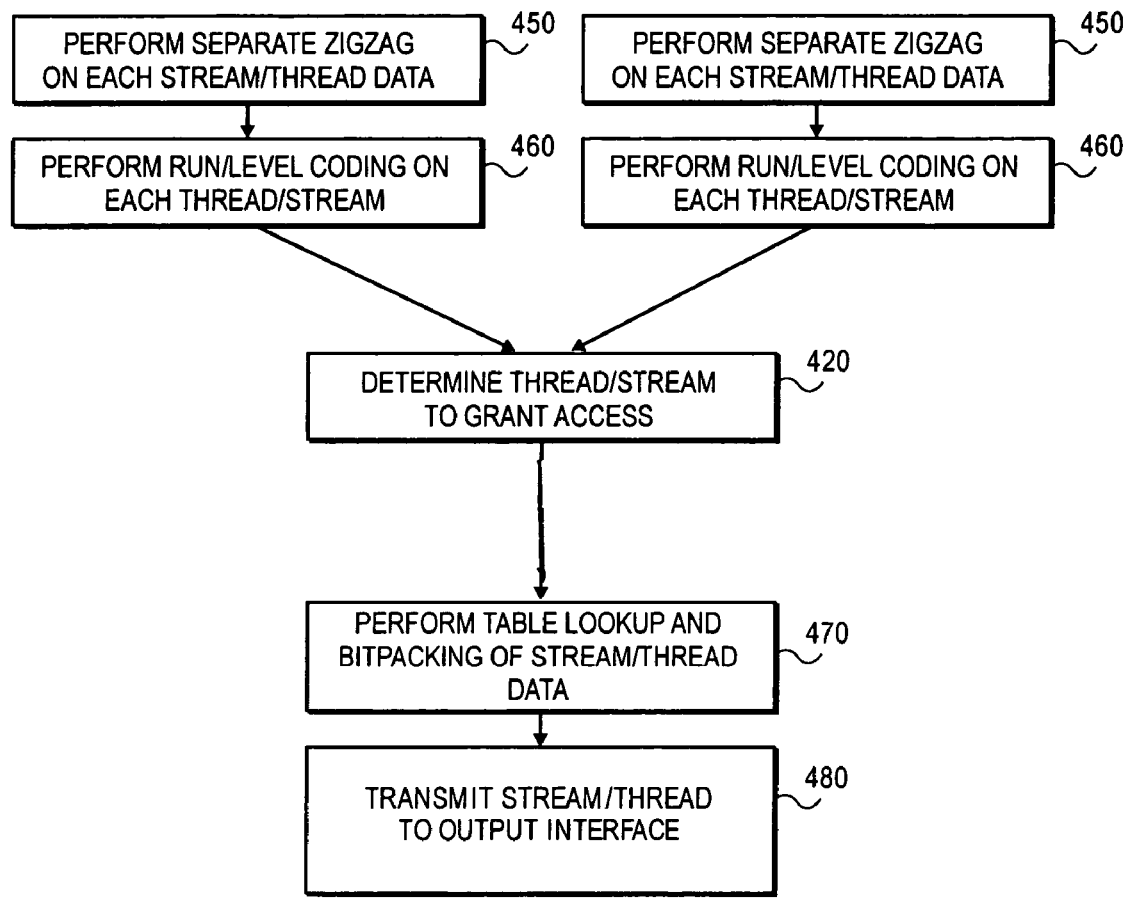
FIG. 4 illustrates a thread/stream arbitration process.

FIG. 4 illustrates thread/stream arbitration process 400. Process 400 begins with blocks 450 where separate preprocessors perform a zigzag operation on each stream/thread (i.e., places data in the stream/thread in a zigzag order). In blocks 460 run/level coding is performed separately for each stream/thread. Process 400 continues with block 470 where a VLC table lookup is performed on each run/level pair to determine the variable length codeword and the codeword is bitpacked. Block 420 determines whether to grant a requesting thread/stream to be processed based on resource availability.

FIG. 5 illustrates a stream/thread arbitration state diagram. In the state diagram, the input signals comprise: request signal for a first stream/thread (reqT0), request signal for a second stream/thread (reqT1), end signal for the first stream/thread (endT0), and end signal for the second stream/thread (endT1). The Output signals comprise: grant signal for the first thread/stream (grantT0), grant signal for the second thread/stream (grantT1), increment counter signal for the first thread/stream (incT0Cnt), and increment counter signal for the second thread/stream (incT1Cnt). As illustrated, from T0 or T1 when no requests for T1 or T0 are made the VLC returns to an idle state. A T1 request is granted when no T0 requests are made and a request for T1 is made. A T0 request is granted when a T0 request is made. Arbitration from T0 to T1 is made when a request for T1 is made and the end of the block for T0 without a T0 request existing. Arbitration from T1 to T0 is made when a request for T0 is made and the end of the block for T1 without a T1 request existing.

Figure 6:
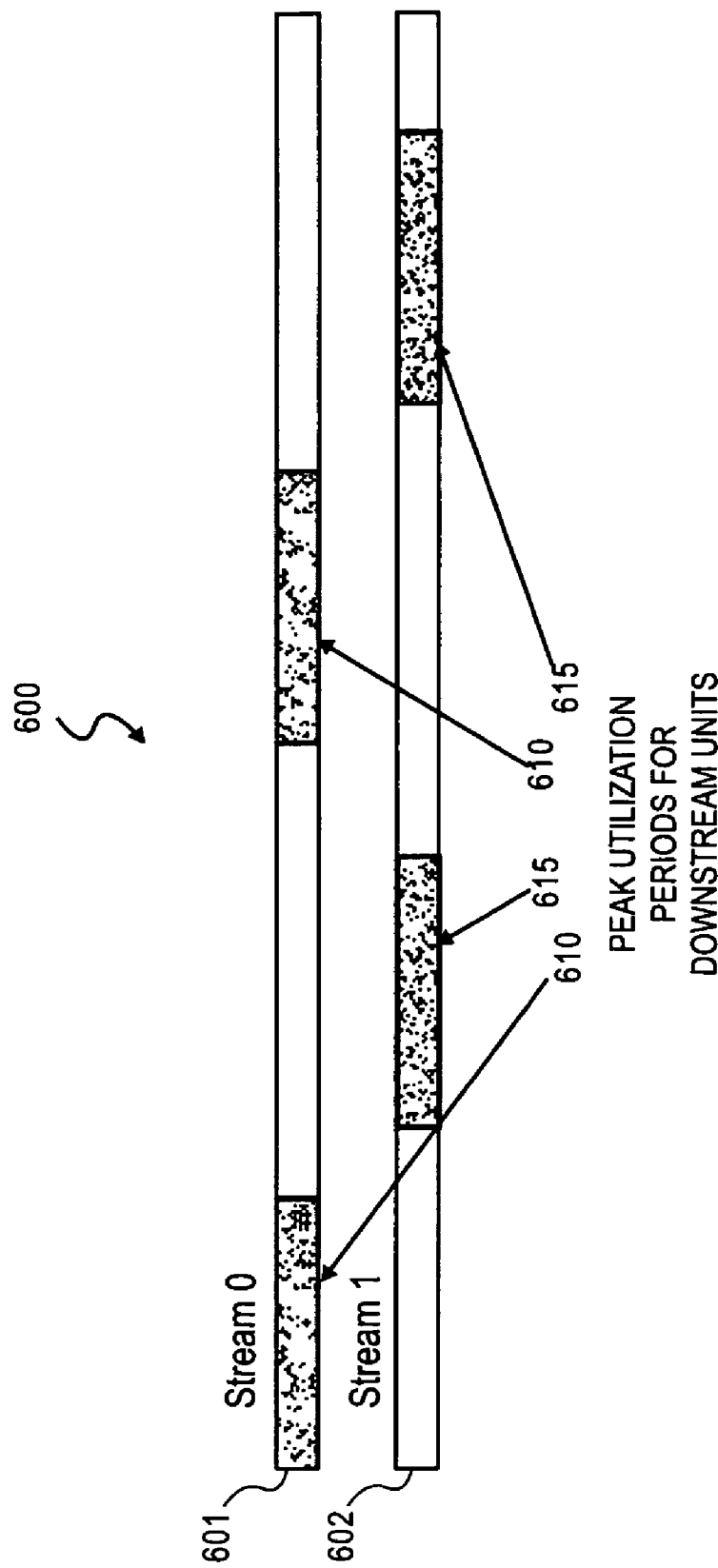
FIG. 6 illustrates peak utilization periods for two streams processed by a VLC unit.

FIG. 6 illustrates peak utilization periods for two streams processed by an embodiment including a VLC unit. Stream 0 (referenced as 601) has peak utilization periods 610, which correspond to post processing by codeword table lookups and bitpacking processes where data is non-zero. Stream 1 (referenced as 602) has peak utilization periods 615, which correspond to post processing by codeword table lookups and bitpacking processes where data is non-zero. As illustrated, the peak utilization periods 610 and 615 occur when postprocessing functions (i.e., codeword table lookup and bitpacking) are not being performed for the other stream.

By simultaneously preprocessing two input streams/threads, the above embodiments including a VLC with at least two preprocessing units can roughly double the performance of typical VLC pipelines. Therefore, the above embodiments increase performance by roughly doubling the VLC throughput. Moreover, the increased performance does not require as much die area as would be required if the post-processing unit were duplicated (i.e., two table lookup units, two bitpacking units).

Figure 7:
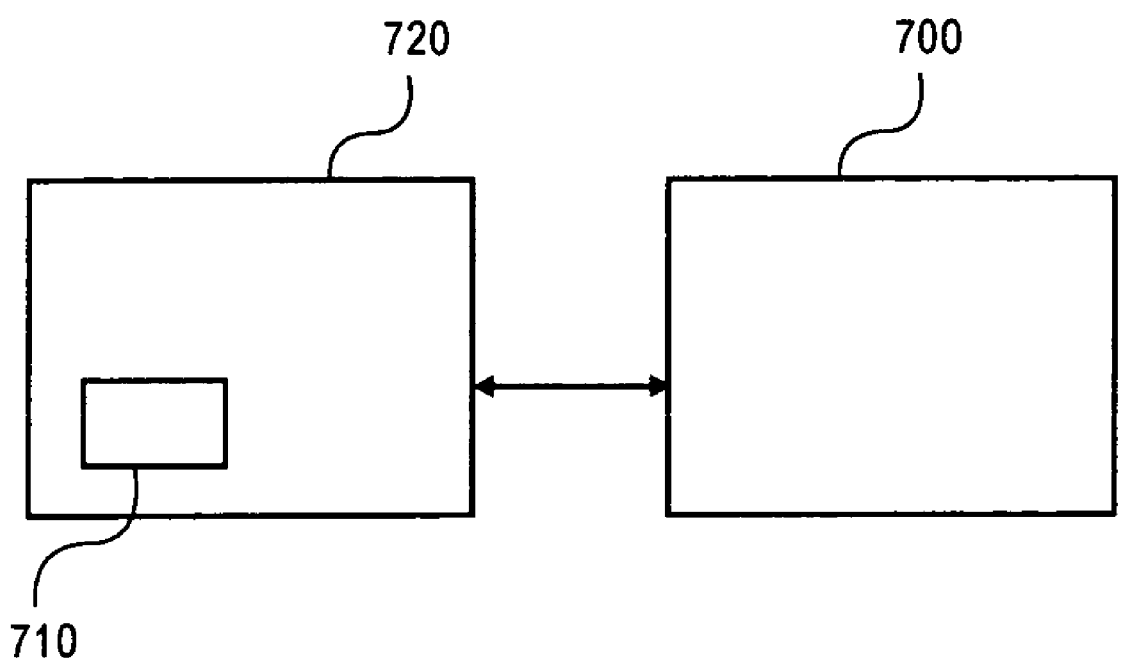
FIG. 7 illustrates an embodiment including a processing chip and an arbitration process.

FIG. 7 illustrates an embodiment including an apparatus having processing chip 720 coupled to memory 700, such as a RAM, static RAM (SRAM), dynamic RAM (DRAM), synchronous DRAM (SDRAM), read-only memory (ROM), etc. In one embodiment arbitration process 710 performs operations on multiple input streams with at least two preprocessing units. Memory 700 can store instructions loaded into a PE 310 having a VLC unit. Processing chip 720 is coupled to memory 700 by a bus, such as an internal bus, a network (such as a local area network (LAN) or wide area network (WAN)), etc. In one embodiment, a PE 310 having an embodiment with dual preprocessing units outputs video streams to other PEs 310 within an ISP 210 or to other PEs within other ISPs.

The above embodiments can also be stored on a device or machine-readable medium and be read by a machine to perform instructions. The machine-readable medium includes any mechanism that provides (i.e., stores and/or transmits) information in a form readable by a machine (e.g., a computer). For example, a machine-readable medium includes read-only memory (ROM); random-access memory (RAM); magnetic disk storage media; optical storage media; flash memory devices; biological electrical, mechanical systems; electrical, optical, acoustical or other form of propagated signals (e.g., carrier waves, infrared signals, digital signals, etc.). The device or machine-readable medium may include a micro-electromechanical system (MEMS), nanotechnology devices, organic, holographic, solid-state memory device and/or a rotating magnetic or optical disk. The device or machine-readable medium may be distributed when partitions of instructions have been separated into different machines, such as across an interconnection of computers.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. An apparatus comprising:
    a variable length coding unit including:
        an input unit to simultaneously encode a first input stream and a second input stream having alternating peak utilization periods,
        a thread stream switching unit coupled to the input unit to arbitrate between the first input stream and the second input stream by giving a higher priority to an input stream that is currently being processed,
        an output unit coupled to said stream switching unit to transmit output streams to an output interface coupled to said output unit.

2. The apparatus of claim 1, said input unit comprising:
    a first preprocessor and a second preprocessor coupled to an input interface, said first preprocessor to receive a first input stream from said input interface, said second preprocessor to receive a second input stream from said input interface.

3. The apparatus of claim 1, said output unit comprising: a table lookup unit coupled to a bit packing unit.

4. The apparatus of claim 1, wherein said stream switching unit adjusts transmission of said first input stream and said second input stream where a peak utilization period for said first input stream and a peak utilization period for said second input stream are non-overlapping.

5. The apparatus of claim 1, wherein said first input stream and said second input stream are components from a single video stream.

6. A system comprising:
    a plurality of image signal processors (ISPs), each ISP including a plurality of processor elements (PEs), at least one of the plurality of ISPs including:
        a variable length coding unit including:
            a first preprocessor unit to encode a first input stream;
            a second preprocessor unit to simultaneously encode a second input stream,
            a stream switching unit coupled to the first and second processor units to arbitrate between the first input stream and the second input stream by giving a higher priority to an input stream that is currently being processed, and
            a postprocessing unit coupled to said stream switching unit to transmit at least two output streams to an output interface coupled to said postprocessing unit,
    said at least one of the plurality of ISPs coupled to a memory including at least one executing application.

7. The system of claim 6, wherein said plurality of ISPs arranged in a matrix pattern and each having quad-ports.

8. The system of claim 6, said plurality of PEs each coupled to a register file switch.

9. The system of claim 6, said first preprocessor and said second preprocessor each include a zigzag unit coupled to a run level coding unit, said first preprocessor to receive a first input stream from an input interface, said second preprocessor to receive a second input stream from said input interface.

10. The system of claim 6, said output unit comprising:
    a table lookup unit coupled to a bit packing unit.

11. The system of claim 6, said stream switching unit adjusts transmission of said at least two input streams where a peak utilization period for each of said at least two input streams are non-overlapping.

12. The system of claim 6, wherein said at least two input streams are luma and chroma components of a single video steam.

13. A computer-readable medium containing instructions that, when executed, cause a machine to:
    determine whether one of a first data block a second data block has completed separate preprocessing;
    increment one of a first counter associated with a first thread and a second counter associated with a second thread if preprocessing a full blocksize is not complete,
    and a thread switching process arbitrating between said first data block and said second data block by giving a higher priority to a data block that is currently being processed, and
    postprocessing said first thread and said second thread by adjusting so peak utilization periods for said first thread alternate with peak utilization periods for said second thread.

14. The computer-readable medium of claim 13, further containing instructions that, when executed, cause a machine to:
    perform a table lookup for a codeword for one of said first thread and said second tread; and
    perform bitpacking on said codeword for one of said first thread and said second thread.

15. The computer-readable medium of claim 13, wherein preprocessing includes:
    separately performing a zigzag ordering for data of one of said first thread and said second thread; and
    separately performing run level coding for data of one of said first thread and said second thread.

16. A method comprising:
    independently preprocessing a first input stream and a second input stream,
    arbitrating between one of a first thread corresponding to said first input stream and a second thread corresponding to said second input stream by giving a higher priority to a thread that is currently being processed, and
    postprocessing said first thread and said second thread wherein a peak utilization period for said first thread and a peak utilization period for said second thread alternate.

17. The method of claim 16, said preprocessing comprising:
zigzag ordering data simultaneously from said first input stream and said second input stream; and
run level coding simultaneously said data in said first input stream and said second input stream.

18. The method of claim 16, said preprocessing comprising:
searching a lookup table for a codeword for one of said first thread and said second thread, and
bitpacking a codeword found for one of said first thread and said second thread.

* * * * *